(12) United States Patent
Kirsch et al.

(10) Patent No.: US 10,368,164 B2
(45) Date of Patent: *Jul. 30, 2019

(54) APPROACH FOR PARTIALLY PRESERVING MUSIC IN THE PRESENCE OF INTELLIGIBLE SPEECH

(71) Applicant: HARMAN INTERNATIONAL INDUSTRIES, INC., Stamford, CT (US)

(72) Inventors: James M. Kirsch, Salt Lake City, UT (US); Ajay Iyer, Murray, UT (US); Richard Allen Kreifeldt, South Jordan, UT (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 121 days.

This patent is subject to a terminal disclaimer.

(21) Appl. No.: 15/530,989

(22) Filed: Mar. 31, 2017

(65) Prior Publication Data

US 2017/0223451 A1  Aug. 3, 2017

Related U.S. Application Data

(63) Continuation of application No. 14/545,672, filed on Jun. 4, 2015, now Pat. No. 9,615,170.

(Continued)

(51) Int. Cl.
*A61F 11/06* (2006.01)
*G10K 11/16* (2006.01)
(Continued)

(52) U.S. Cl.
CPC ............ *H04R 3/002* (2013.01); *G10L 21/02* (2013.01); *G10L 21/0364* (2013.01);
(Continued)

(58) Field of Classification Search
CPC ..... H04R 3/002; H04R 3/005; G10L 21/0364; G10L 25/84
See application file for complete search history.

(56) References Cited

U.S. PATENT DOCUMENTS

2007/0189544 A1   8/2007   Rosenburg
2010/0119055 A1*  5/2010   Zhang ................. H04M 9/08
                                          379/406.07
(Continued)

FOREIGN PATENT DOCUMENTS

WO    2011112382 A1    9/2011
WO    2014022359 A2    2/2014

OTHER PUBLICATIONS

European search report for Application No. EP 15 17 1024, dated Dec. 3, 2015.

*Primary Examiner* — Simon King
(74) *Attorney, Agent, or Firm* — Artegis Law Group, LLP (57) ABSTRACT

An audio processing system for a listening device includes an input device, a voice activity detector and a ratio-based attenuator. The input device is configured to receive a first audio signal emanating from an environment and including a signal of interest. The voice activity detector is configured to generate a control signal in response to the first audio signal. The ratio-based attenuator is configured to receive the control signal and determine whether the signal level of the first audio signal exceeds the signal level of an audio signal received from an audio playback device by at least a target difference. If so, then the audio level of the playback audio signal is maintained. Otherwise, the audio level of the playback audio signal is adjusted, where, at the adjusted value, the first signal level exceeds the playback signal level by at least the target difference.

16 Claims, 5 Drawing Sheets
(2 of 5 Drawing Sheet(s) Filed in Color)

Related U.S. Application Data (60) Provisional application No. 62/009,851, filed on Jun. 9, 2014.

(51) Int. Cl.
*H03B 29/00* (2006.01)
*H04R 3/00* (2006.01)
*G10L 25/78* (2013.01)
*G10L 21/02* (2013.01)
*G10L 21/0364* (2013.01)
*G10L 25/84* (2013.01)
*H04R 1/10* (2006.01)
*H03G 9/00* (2006.01)
*H03G 9/02* (2006.01)
*H04R 3/04* (2006.01)

(52) U.S. Cl.
CPC .............. *G10L 25/78* (2013.01); *G10L 25/84* (2013.01); *H03G 9/005* (2013.01); *H03G 9/025* (2013.01); *H04R 1/1041* (2013.01); *H04R 3/005* (2013.01); *H04R 3/04* (2013.01); *H04R 2420/01* (2013.01); *H04R 2420/07* (2013.01); *H04R 2430/01* (2013.01)

(56) References Cited

U.S. PATENT DOCUMENTS

| | | | |
|---|---|---|---|
| 2010/0211199 A1* | 8/2010 | Naik | G10L 21/00 700/94 |
| 2015/0110294 A1* | 4/2015 | Chen | H03G 7/002 381/106 |
| 2015/0215701 A1* | 7/2015 | Usher | H04R 1/1041 381/71.6 |
| 2015/0280676 A1* | 10/2015 | Holman | G10L 19/008 381/80 |
| 2016/0036962 A1* | 2/2016 | Rand | H04R 1/1041 455/418 |

* cited by examiner

APPROACH FOR PARTIALLY PRESERVING MUSIC IN THE PRESENCE OF INTELLIGIBLE SPEECH

CROSS-REFERENCE TO RELATED APPLICATIONS

This application is a continuation of the co-pending U.S. patent application titled, "APPROACH FOR PARTIALLY PRESERVING MUSIC IN THE PRESENCE OF INTELLIGIBLE SPEECH," filed on Jun. 4, 2015 and having application Ser. No. 14/545,672, which claims priority benefit of U.S. provisional patent application titled, "METHOD TO PARTIALLY PRESERVE THE MUSIC IN THE PRESENCE OF INTELLIGIBLE SPEECH," filed on Jun. 9, 2014 and having Ser. No. 62/009,851. The subject matter of these related applications is hereby incorporated herein by reference.

BACKGROUND

Field of the Embodiments of the Present Disclosure

Embodiments of the present disclosure relate generally to audio signal processing and, more specifically, to an approach for partially preserving music in the presence of intelligible speech.

Description of the Related Art

Headphones, earphones, earbuds, and other personal listening devices are commonly used by individuals who desire to listen to a particular type of audio source, such as music, speech, or movie soundtracks, without disturbing other people in the nearby vicinity. These types of audio sources are referred to herein as "entertainment" signals, and each is typically characterized as an audio signal that is present over a sustained period of time. Typically, these personal listening devices include an audio plug for insertion into an audio output of an audio playback device. The audio plug connects to a cable that carries the audio signal from the audio playback device to the personal listening device. In order to provide high quality audio, such personal listening devices include speaker components that typically cover the entire ear or completely seal the ear canal. The personal listening device is designed to provide a good acoustic seal, thereby reducing audio signal leakage and improving the quality of the listener's experience, particularly with respect to bass response.

One drawback of the personal listening devices described above is that, because the devices form a good acoustic seal with the ear, the ability of the listener to hear environmental sound is substantially reduced. As a result, the listener may be unable to hear certain important sounds from the environment, such as the sound of an oncoming vehicle, human speech, or an alarm. These types of important sounds emanating from the environment are referred to herein as "priority" or "alert" signals, and each is typically characterized as an audio signal that is intermittent, acting as an interruption.

One solution to the above problem is to acoustically or electronically mix or combine environmental sound, including any alert signal present in the environmental sound, detected by one or more microphones with the entertainment signal. The listener is then able to hear both the entertainment signal and the environmental sound, including any alert signal. One drawback with such solutions, though, is that the alert signal may be unintelligible (or may even be inaudible) if the entertainment signal is too loud relative to the alert signal.

As the foregoing illustrates, more effective techniques for providing entertainment signals and alert signals to users of listening devices would be useful.

SUMMARY

One or more embodiments set forth an audio processing system for a listening device that includes an input device, a voice activity detector and a ratio-based attenuator. The input device is configured to receive a first audio signal emanating from an environment and including a signal of interest. The voice activity detector is configured to generate a first control signal in response to the first audio signal. The ratio-based attenuator is configured to receive the first control signal. The ratio-based attenuator is further configured to determine whether a first signal level associated with the first audio signal exceeds a second signal level associated with a second audio signal received from an audio playback device by at least a target difference. The ratio-based attenuator is further configured to, if the first signal level exceeds the second signal level by at least a target difference, then maintain an audio level of the second audio signal. The ratio-based attenuator is further configured to if the first signal level does not exceed the second signal level by at least the target difference, then cause the audio level of the second audio signal to be adjusted from a first value to a second value, wherein, at the second value, the first signal level exceeds the second signal level by at least the target difference.

Other embodiments include, without limitation, a computer readable medium including instructions for performing one or more aspects of the disclosed techniques, as well as a method for performing one or more aspects of the disclosed techniques.

At least one advantage of the disclosed approach is that a listener who uses the disclosed listening device equipped with the audio processing system 100 hears a high-quality audio signal from an audio playback device plus certain alert signals from the environmental sound, while, at the same time, other sounds from the environmental sound are suppressed relative to the alert signal.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

So that the manner in which the above recited features of embodiments of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of certain specific embodiments. However, it will be apparent to one of skill in the art that other embodiments may be practiced without one or more of these specific details or with additional specific details.

As described herein, an audio processing system in a listening device determines when an alert signal is present in the environmental sound and, in response, intelligently attenuates or ducks the audio level of an entertainment signal to maintain a voice-to-music ratio (VMR) at or near a target value. Stated another way, the audio processing system maintains a relatively constant alert signal level to entertainment signal level ratio (AER). Although the disclosed techniques are described in the context of a personal listening device, the techniques may also be applied to other audio systems, including, without limitation, a public address system. In general, the entertainment signal level corresponds to the volume setting on a playback device as set by a listener. The alert signal level corresponds to the strength of a signal of interest, such as speech, present in the environment. In one example, and without limitation, a low alert signal level could result from a soft-spoken server at a restaurant announcing that the table is ready. If the server's announcement is quieter than the voices of patrons, other servers, or the maître d', the entertainment signal is more heavily attenuated so that the server's voice can be heard. In another example, and without limitation, a low alert signal level could result from a fellow cyclist speaking at some distance away from the listener wearing earbuds that include microphones. Because sound levels are reduced over space due to acoustic spreading, a cyclist who is 20 feet away from the listener sounds quieter than a cyclist who is 6 feet away. As a result, the amount of ducking applied to the entertainment signal increases as the strength of the entertainment signal increases. However, the amount of ducking applied to the entertainment signal decreases as the strength of the alert signal increases.

The audio processing system applies intelligent ducking when an alert signal is actually present in the environment audio and is sufficiently loud. Therefore, if there is no alert signal or if a signal of interest, referred to herein as a potential alert signal, is at a negligible level, then audio processing system does not apply ducking to the entertainment signal. As a result, low-level, steady-state background sounds, such as distant, quiet, conversations at a large distance, are prevented from engaging the ducking system. This audio processing system is now described in greater detail.

System Overview

Figure 1:
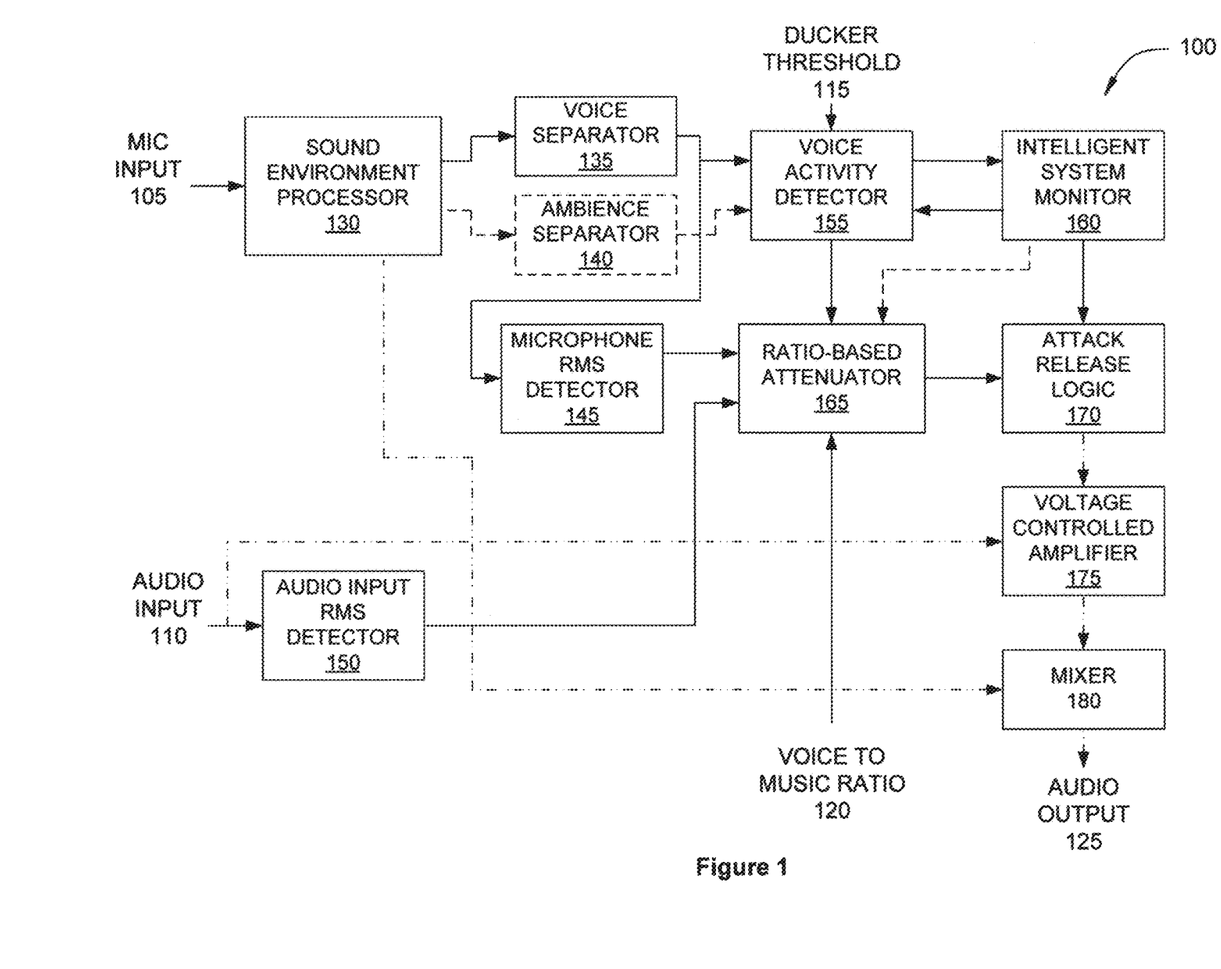
FIG. 1 illustrates an audio processing system configured to implement one or more aspects of the various embodiments.

FIG. 1 illustrates an audio processing system 100 configured to implement one or more aspects of the various embodiments. As shown, audio processing system 100 includes, without limitation, sound environment processor 130, voice separator 135, ambience separator 140, microphone root-mean square (RMS) detector 145, audio input RMS detector 150, voice activity detector 155, ratio-based attenuator 165, intelligent system monitor 160, attack release logic 170, voltage controlled amplifier 175, and mixer 180.

Sound environment processor 130 receives a microphone (mic) input signal 105 from one or more microphones that capture sound emanating from the environment. In some embodiments, sound environment processor 130 receives sound emanating from the environment electronically rather than via one or more microphones. Sound environment processor 130 performs noise reduction on the microphone input. Sound environment processor 130 cleans and enhances the microphone input by removing one or more noise signals, including, without limitation, microphone (mic) hiss, steady-state noise, very low frequency sounds (such as traffic din), and other low-level, steady-state sounds, while leaving intact any potential alert signal. In general, a low-level sound is a sound with a signal level that is below a threshold of loudness. In some embodiments, a gate may be used to remove such low-level signals from the input signal before transmitting the processed signal as an output. In general, a steady-state sound is a sound with a signal amplitude that remains relatively constant over time, in contrast to a transient sound with a signal amplitude that changes over time. In one example, and without limitation, the sound of an idling car could be considered a steady-state sound while the sound of an accelerating car or a car with a revving engine would not be considered a steady-state sound. In another example, and without limitation, the sound of operatic singing could be considered a steady-state sound while the sound of speech would not be considered a steady-state sound. In yet another example, and without limitation, the sound of very slow, symphonic music could be considered a steady-state sound while the sound of relatively faster, percussive music would not be considered a steady-state sound. The potential alert signal includes sounds that are not low-level, steady-state sound, such as human speech or an automobile horn. Sound environment processor 130 transmits a high-fidelity noise-reduced signal to mixer 180. Sound environment processor 130 also transmits a control signal to voice separator 135, ambience separator 140, and microphone RMS detector 145. In some embodiments, each of the control signals transmitted to voice separator 135, ambience separator 140, and microphone RMS detector 145 may be identical copies of the same signal. The control signal may be a lower fidelity version of the noise-reduced audio that is transmitted to mixer 180.

Voice separator 135 receives a control signal from sound environment processor 130. Voice separator 135 extracts any potential alert signal, such as speech, that is present in the received control signal. In some embodiments, voice separator 135 performs this function by applying a bandpass filter followed by an RMS detector to detect voice signals and other transient signals. In some embodiments, voice separator 135 may determine that audio energy in the range of 500 Hz to 3,000 Hz is considered to be a potential alert signal. In these embodiments, the output from voice separator 135 may be the RMS level of the audio energy in the range of 500 Hz to 3,000 Hz. If the RMS level of the audio in this frequency range exceeds a given threshold, voice separator 135 may determine that a potential alert signal is present. Voice separator 135 transmits a control signal to voice activity detector 155.

Ambience separator 140 is an optional module that receives a control signal from sound environment processor 130. Ambience separator 140 compares the RMS level of the microphone input against a threshold level to detect ambient signals, such as traffic noise, construction noise and other background noise, that pass through sound environment processor 130. In some embodiments, ambience separator 140 performs this function via a feature extraction approach. Ambience separator 140 transmits a control signal to voice activity detector 155.

Microphone RMS detector 145 receives a control signal from voice separator 135. Microphone RMS detector 145 detects the root mean square (RMS) level of the processed microphone input signal received from voice separator 135. Microphone RMS detector 145 calculates the energy of the processed microphone input signal in the log (dB units) domain. In some embodiments, microphone RMS detector 145 may employ an alternative signal level measurement technique other than detecting the RMS level of the signal. In one example, and without limitation, microphone RMS detector 145 employs a more sophisticated psychoacoustic signal level measurement technique. Microphone RMS detector 145 transmits a control signal, corresponding to the detected microphone RMS level, to ratio-based attenuator 165.

Audio input RMS detector 150 receives an entertainment signal from an audio playback device via audio input 110. Audio input RMS detector 150 detects the root mean square (RMS) level of the entertainment signal received via audio input 110. Audio input RMS detector 150 calculates the energy of the entertainment signal in the log (dB units) domain. In some embodiments, audio RMS detector 150 may employ an alternative signal level measurement technique other than detecting the RMS level of the signal. In one example, and without limitation, audio RMS detector 150 employs a more sophisticated psychoacoustic signal level measurement technique. Audio input RMS detector 150 transmits a control signal, corresponding to the calculated entertainment signal input RMS level, to ratio-based attenuator 165.

Voice activity detector 155 receives control signals from voice separator 135, ambience separator 140, and intelligent system monitor 160. Voice activity detector 155 analyzes the received control signals from voice separator 135 and ambience separator 140 and compares these two control signals against a ducker threshold 115 to detect the presence of an alert signal and, if an alert signal is present, whether or not to duck the entertainment audio received via audio input 110. In some embodiments, the ducker threshold 115 may be set via a user control. Voice activity detector 155 determines that an alert signal is present when the control signal received from voice separator 135 exceeds the ducker threshold 115. When ambience separator 140 is present, voice activity detector 155 further determines that an alert signal is present when the control signal received from voice separator 135 includes an alert signal that ambience separator 140 does not identify as an ambient signal. As a result, voice activity detector 155 reduces the likelihood that louder, low-frequency, steady-state sounds are misclassified as alert signals.

In some embodiments, if voice activity detector 155 determines that an alert signal is present, voice activity detector 155 may calculate a control signal based on the ratio of the signal from voice separator 135 versus the ducker threshold 115 If voice activity detector 155 determines that no alert signal is present, then voice activity detector 155 may set this control signal to 1, that is, unity gain, to inhibit ducking of the audio input 110. As further discussed herein, when voice activity detector 155 determines that an alert signal is no longer present, voice activity 155 continues to apply ducking during a ducking hold signal received from intelligent system monitor 160. Voice activity detector 155 transmits a control signal to intelligent system monitor 160 and to ratio-based attenuator 165.

Intelligent system monitor 160 receives a control signal from voice activity detector 155. Intelligent system monitor 160 determines the duration of ducking and the speed of ducking, based on the received control signal. As one example, and without limitation, human speech could vary in volume, where some portions of the human speech could be louder while other portions of the human speech are quieter. In addition, no human speech would be present between words or during short pauses. In such cases, audio ducking could be applied and removed multiple times during speech. Consequently, the entertainment signal present on audio input 110 would be ducked and released from ducking in rapid succession, resulting in an unpleasant listener experience. Intelligent system monitor 160 could effectively apply a hold time to maintain a ducking function for a threshold duration of time after an alert signal is no longer present at the microphone input 105. As a result, ducking would be maintained over short gaps, such as between words or short pauses, but ducking would be released when a relatively long pause is detected.

In some embodiments, intelligent system monitor 160 may determine that duration of ducking may be zero, resulting in no ducking. Intelligent system monitor 160 generates a control signal that identifies when ducking hold time should be applied. Intelligent system monitor 160 transmits the control signal to voice activity detector 155 and attack/release logic 170. Intelligent system monitor 160 optionally transmits the control signal to ratio-based attenuator 165.

Ratio-based attenuator 165 receives RMS audio levels from microphone RMS detector 145 and audio input RMS detector 150. Ratio-based attenuator 165 also receives control signals from voice activity detector 155 and optionally from intelligent system monitor 160. Ratio-based attenuator 165 determines the amount of gain reduction to be applied to the entertainment signal received via audio input 110. Ratio-based attenuator 165 receives a voice-to-music ratio (VMR) 120 that specifies a target level by which the audio input 110 is ducked relative to the microphone input 105. In some embodiments, the VMR 120 may be set via a user control. For example, and without limitation, if the VMR 120 is set to −30 dB and ducking is applied, then ratio-based attenuator 165 sets the attenuation of the signal received at audio input 110 so that the level of audio input 110 is at least −30 dB relative to the microphone input 105. If the control signal from intelligent system monitor 160 indicates that ducking hold time is applied, then ratio-based attenuator 165 maintains the most recent ducking level until the ducking hold is removed. During ducking hold time, ratio-based attenuator 165 neither increases nor decreases the ducking level. Ratio-based attenuator 165 generates a control signal that indicates the amount that the audio input 110 signal is to be ducked. In general, ratio-based attenuator 165 modifies the level of the entertainment signal via attenuation, rather than amplification, so the gain of the entertainment signal does not exceed unity. Ratio-based attenuator 165 transmits this control signal to attack/release logic 170.

Attack/release logic 170 receives control signals from intelligent system monitor 160 and ratio-based attenuator 165. Based on these control signals, attack/release logic 170 applies a smoothing function to the gain reduction resulting from ducking in order to prevent undesirable modulation of the entertainment signal received via audio input 110. In some embodiments, attack/release logic 170 may employ asymmetric attack and release profiles, such as a relatively fast attack profile and a relatively slower release profile. Attack/release logic 170 applies a fast attack to quickly duck the audio input 110 signal when a new alert signal is detected in order to avoid cutting off the beginning of the alert signal and, thereby, preserve the intelligibility of speech. Attack/release logic 170 applies a relatively slower release to avoid abrupt changes to the entertainment signal when an alert signal is no longer detected.

Additionally, in some embodiments, attack/release logic 170 may apply a hysteresis logic to prevent undesirable modulation of the entertainment signal when the ducker is engaged. Via this hysteresis logic, attack/release logic 170 employs a slower attack/slower release profile when audio ducking is near the target ducking level, based on the control signal received from intelligent system monitor 160. This control signal indicates whether an alert signal has recently appeared or disappeared in the microphone input 105 signal, or whether the signal of interest has been present for a threshold duration of time. If an alert signal has recently appeared or disappeared, then attack/release logic 170 applies a fast attack/slow release profile. If, on the other hand, an alert signal has been present for a threshold period of time, then attack/release logic 170 applies a slower attack/slower release profile. The slower attack/slower release profile still responds to changes in RMS levels received from the microphone input 105 and audio input 110, but at a slower response rate relative to the fast attack/slow release profile. Attack/release logic 170 transmits a smoothed gain control signal to voltage controlled amplifier 175.

Voltage controlled amplifier 175 receives a smoothed gain control signal from attack/release logic 170. Voltage controlled amplifier 175 receives the entertainment signal via the audio input 110. Voltage controlled amplifier 175 applies the smoothed gain control signal to the entertainment signal to generate a ducked entertainment signal. When audio ducking is applied, voltage controlled amplifier 175 applies more attenuation to the entertainment signal when the entertainment signal received via the audio input 110 is relatively louder or when the alert signal received via the microphone input 105 is relatively quieter. When no audio ducking is applied, voltage controlled amplifier 175 passes the entertainment signal received via the audio input 110 without attenuation. Voltage controlled amplifier 175 passes the resulting ducked entertainment signal to mixer 180.

Mixer 180 receives noise-reduced microphone audio from sound environment processor 130 and the ducked entertainment signal from voltage controlled amplifier 175. Mixer 180 mixes or combines the two received audio signals to generate an output signal. In some embodiments, mixer 180 may perform a simple additive or multiplicative mix on the two audio signals. In other embodiments, mixer 180 may perform any technically feasible mix or combine function on the two audio signals. Mixer 180 transmits the output signal to one or more speakers via audio output 125.

In various embodiments, audio processing system 100 may be implemented as a state machine, a central processing unit (CPU), digital signal processor (DSP), a microcontroller, an application-specific integrated circuit (ASIC), or any device or structure configured to process data and execute software applications. In some embodiments, one or more of the blocks illustrated in FIG. 1 may be implemented with discrete analog or digital circuitry. In one example, and without limitation, the voltage controlled amplifier 175 and mixer 180 could be implemented with analog components. Audio processing system 100 may be associated with a mobile computer, dash-mounted device, personal digital assistant, mobile phone, wearable device, mobile device or any other device suitable for practicing one or more embodiments of the present invention. Audio processing system 100 may be configured to implement an intelligent audio processing system 100, as further described herein. This audio processing system 100 may be implemented in any technically feasible form factor, including, without limitation, headphones or ear buds with situational awareness (e.g. via microphones), broadcast systems, interruptible foldback (IFB) systems, or paging systems.

Operations of the Audio Processing System

Figure 2:
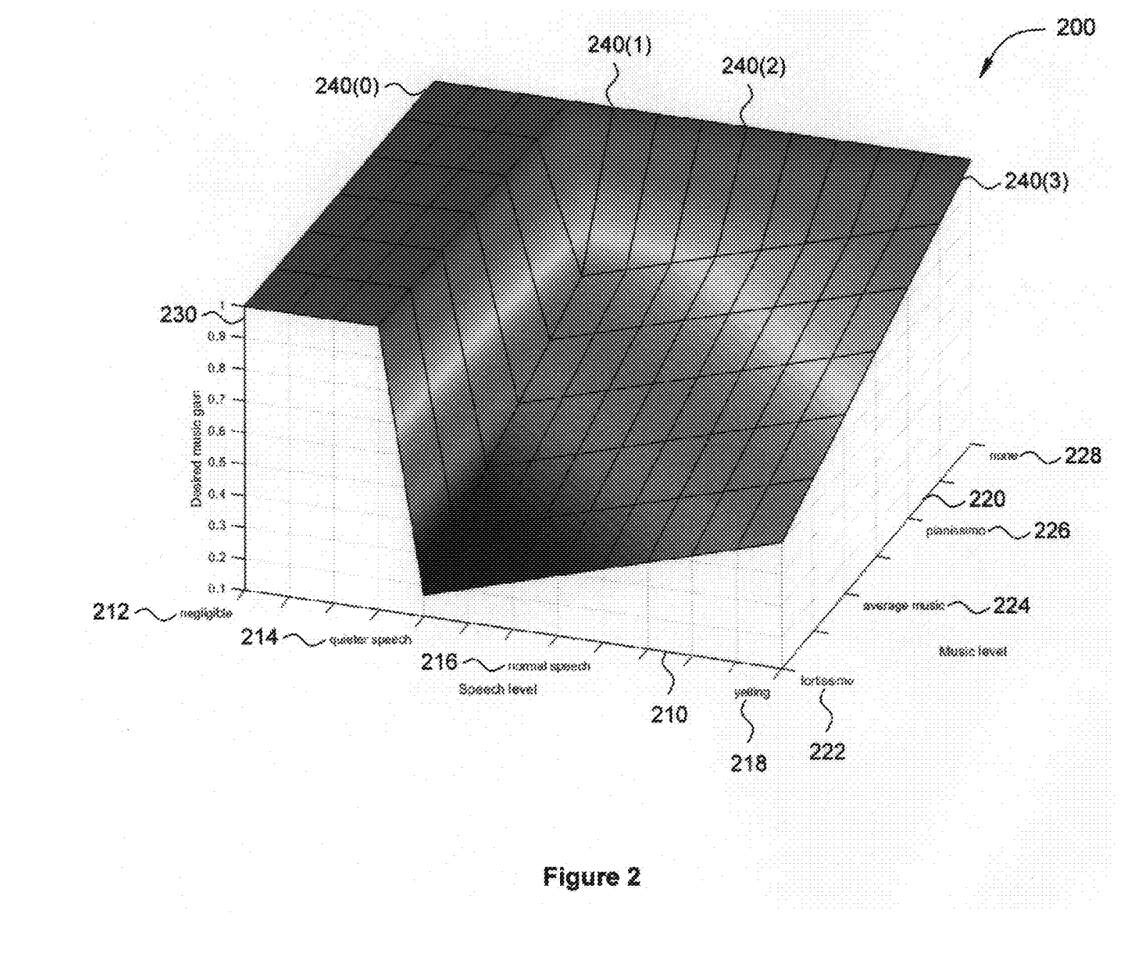
FIG. 2 illustrates an exemplary audio ducking function performed by the audio processing system of FIG. 1, according to various embodiments.

FIG. 2 illustrates an exemplary audio ducking function 200 performed by the audio processing system 100 of FIG. 1, according to various embodiments. As shown, and without limitation, the audio ducking function 200 is superimposed onto a 3-axis coordinate system, where the three axes include a speech level axis 210, a music level axis 220, and a desired music gain axis 230.

The speech level axis 210 includes discrete levels for negligible speech 212, quieter speech 214, normal speech 216, and yelling 218. Similarly, the music level axis 220 includes discrete levels for fortissimo (very loud) music 222, average music 224, pianissimo (very soft) music 226, and none (no music) 228. Although discrete levels are indicated on the speech level axis 210 and on the music level axis 220, both of these axes are continuous and include values between the discrete levels as shown. The desired music gain axis 230 indicates a multiplier to apply to the incoming music signal based on the speech level, as shown on the speech level axis 210, and on the music level, as shown on the music level axis 220. A value of 1 on the desired music gain axis 230 indicates that the incoming music is multiplied by 1, a value of 0.9 on the desired music gain axis 230 indicates that the incoming music is multiplied by 0.9, value of 0.8 on the desired music gain axis 230 indicates that the incoming music is multiplied by 0.8, and so on. As shown, A "unity" gain of 1.0 (dark red) indicates no attenuation of the input music signal, and a "null" gain of 0.0 (dark blue) indicates heavy attenuation (e.g. 30 dB) of the input music signal.

Following the line segment 240(0), corresponding to a negligible speech level, the desired music gain is 1 regardless of the music level. Line segment 240(0) indicates that there is no attenuation of the music signal when the speech level is negligible. Therefore, the listener hears only the music signal.

Following the line segment 240(1), corresponding to a quieter speech level, the desired music gain is approximately 0.18 when the music level is fortissimo. The desired music gain increases as the music level decreases until the desired music gain is 1 when there is no music signal. Line segment 240(1) indicates that a fortissimo music signal is significantly attenuated to ensure that a quieter speech level is audible over very loud music. Less attenuation is warranted for lower music levels, and no attenuation is needed when no music signal is present, such as during the silent gaps between songs. In one embodiment, when no music signal is present, the prior ducking level may be maintained for a threshold period of time in order to prevent a change in ducking level between songs.

Following the line segment 240(2), corresponding to a normal speech level, the desired music gain is approximately 0.32 when the music level is fortissimo. The desired music gain increases as the music level decreases until the desired music gain is 1 when there is no music signal. Line segment 240(2) indicates that a fortissimo music signal is moderately attenuated to ensure that a normal speech level is audible over very loud music. Less attenuation is warranted for lower music levels, and no attenuation is needed when no music signal is present.

Following the line segment 240(3), corresponding to a very loud speech level, such as yelling, the desired music gain is approximately 0.50 when the music level is fortissimo. The desired music gain increases as the music level decreases until the desired music gain is 1 when there is no music signal. Line segment 240(3) indicates that a fortissimo music signal is lightly attenuated to ensure that a loud level speech is audible over very loud music. Less attenuation is warranted for lower music levels, and no attenuation is needed when no music signal is present.

The audio ducking function 200 illustrated in FIG. 2 bases the desired music gain on both the speech level and the music level in order to adapt to various combinations of music and speech levels. In general, the desired music gain increases as the music level decreases. The desired music gain remains constant as the speech level increases from negligible until quieter speech is detected. The desired music level then sharply decreases to a relatively low level and then gradually increases as the speech level increases from quieter speech to very loud speech.

Figure 3:
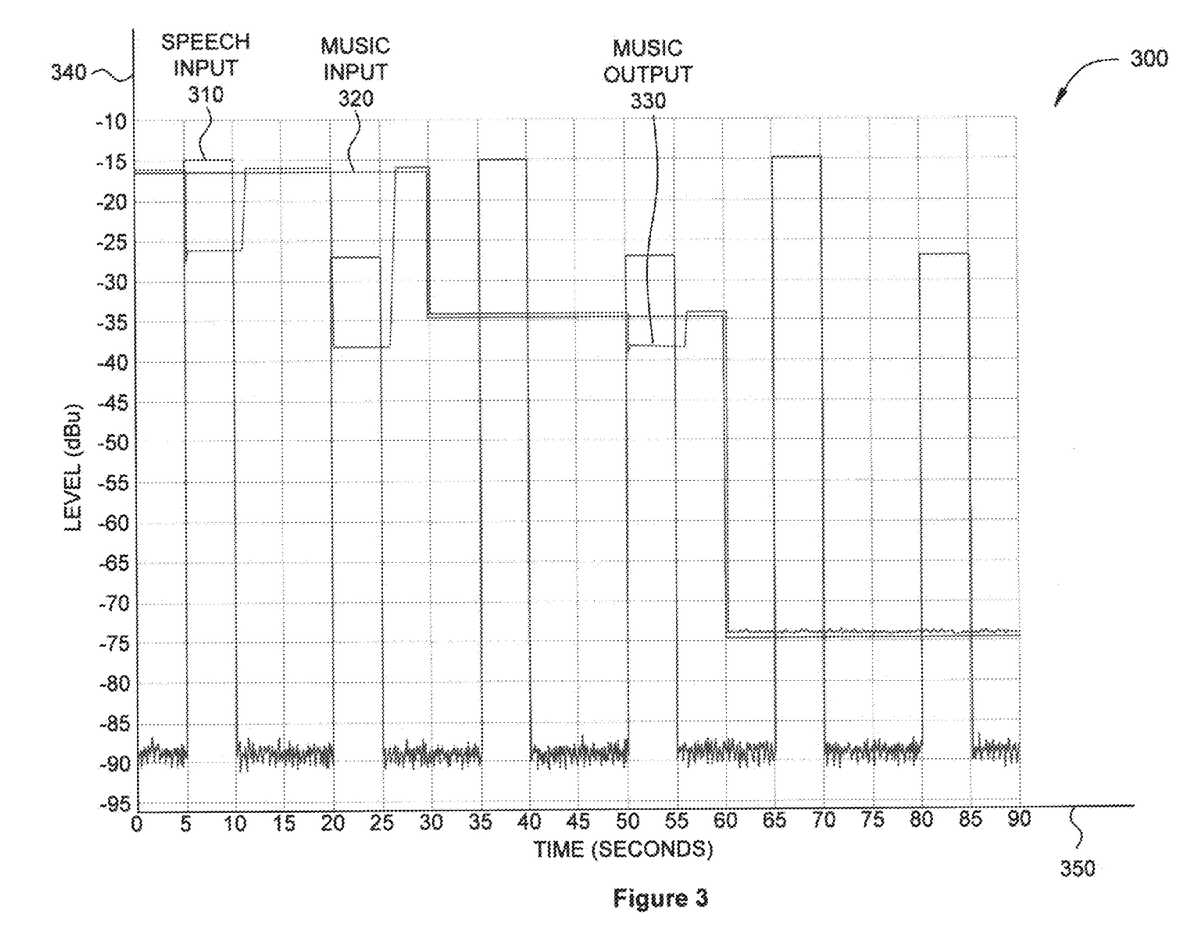
FIG. 3 sets forth an exemplary set of waveforms that illustrates the audio ducking function performed by the audio processing system of FIG. 1, according to various embodiments.

FIG. 3 sets forth an exemplary set of waveforms 300 that illustrates the audio ducking function performed by the audio processing system 100 of FIG. 1, according to various embodiments. As shown, and without limitation, the set of waveforms 300 includes an input speech waveform 310, an input music waveform 320, and an output music waveform 330. These three waveforms are superimposed onto a 2-axis coordinate system. The vertical axis 340 indicates audio voltage level in dBu, a root mean square (RMS) measurement of voltage referenced to approximately 0.775 V RMS. The horizontal axis 350 indicates time in seconds.

The input music level, as shown by input music waveform 320 begins at −16 dBu during the time interval t=0 to t=30. The input music level reduces to −35 dBu during the time interval t=30 to t=60. The input music level reduces further to −75 dBu during the time interval t=60 to t=90.

During the time interval t=0 to t=5, the input speech waveform 310 indicates that no speech (approximately −90 dBu input level) is present. During this period, no ducking occurs, and the level of the output music waveform 330 remains at the level of the input music waveform 320. During the time period t=5 to t=10, the input speech waveform 310 indicates that speech is present at a level of −15 dBu. The input music level is ducked to a level that is 11 dB below the speech level. Because the input music level is at −16 dBu (below the input speech level), the level of the output music waveform 330 is ducked 10 dB to −26 dBu. During the time period t=10 to t=20, no speech (approximately −90 dBu input level) is present, and the ducking function is released, allowing the output music level to return to the −16 dBu level. During the time period t=20 to t=25, the input speech waveform 310 indicates that speech is present at a quieter level of −27 dBu. The input music level is ducked 22 dB to a level that is 11 dB below the speech level, or −38 dBu.

During the time interval t=25 to t=35, the input speech waveform 310 indicates that no speech (approximately −90 dBu input level) is present. During this period, no ducking occurs, and the level of the output music waveform 330 returns to the level of the input music waveform 320. At time t=30, the input music level, and, correspondingly, the output music level, is reduced to −35 dBu. During the time period t=35 to t=40, the input speech waveform 310 indicates that speech is present at a level of −15 dBu. Because the input music level is already more than 11 dB below the speech level, no ducking occurs. During the time period t=40 to t=50, no speech (approximately −90 dBu input level) is present, and the output music level remains at the input music level of −35 dBu. During the time period t=50 to t=55, the input speech waveform 310 indicates that speech is present at a quieter level of −27 dBu. The input music level is ducked to a level that is 11 dB below the speech level. Because the input music level is at −35 dBu (below the input speech level), the level of the output music waveform 330 is ducked 3 dB to −38 dBu.

During the time interval t=55 to t=65, the input speech waveform 310 indicates that no speech (approximately −90 dBu input level) is present. During this period, no ducking occurs, and the level of the output music waveform 330 returns to the level of the input music waveform 320. At time t=60, the input music level, and, correspondingly, the output music level, is reduced to −75 dBu. During the time period t=65 to t=70, the input speech waveform 310 indicates that speech is present at a level of −15 dBu. Because the input music level is already more than 11 dB below the speech level, no ducking occurs. During the time period t=70 to t=80, no speech (approximately −90 dBu input level) is present, and the output music level remains at the input music level of −75 dBu. During the time period t=80 to t=85, the input speech waveform 310 indicates that speech is present at a quieter level of −27 dBu. Again, the input music level is already more than 11 dB below the speech level, and no ducking occurs. Finally, during the time period t=85 to t=90, no speech (approximately −90 dBu input level) is present, and the output music level remains at the input music level of −75 dBu.

Note that the output music waveform 330 indicates a fast attack time when applying ducking at t=5, t=20, and t=50, as illustrated by the relatively short fall time. The output music waveform 330 indicates a slower release time when releasing ducking at t=10, t=25, and t=55, as illustrated by the longer rise time. The rapid attack function allows the speech signal to pass through the listening device quickly to avoid cutting the initial portion of the speech signal. The long release function allows the audio ducking to release slowly, providing a less jarring experience for the listener and allowing for short gaps and pauses during speech before fully releasing the ducking function.

Figure 4A:
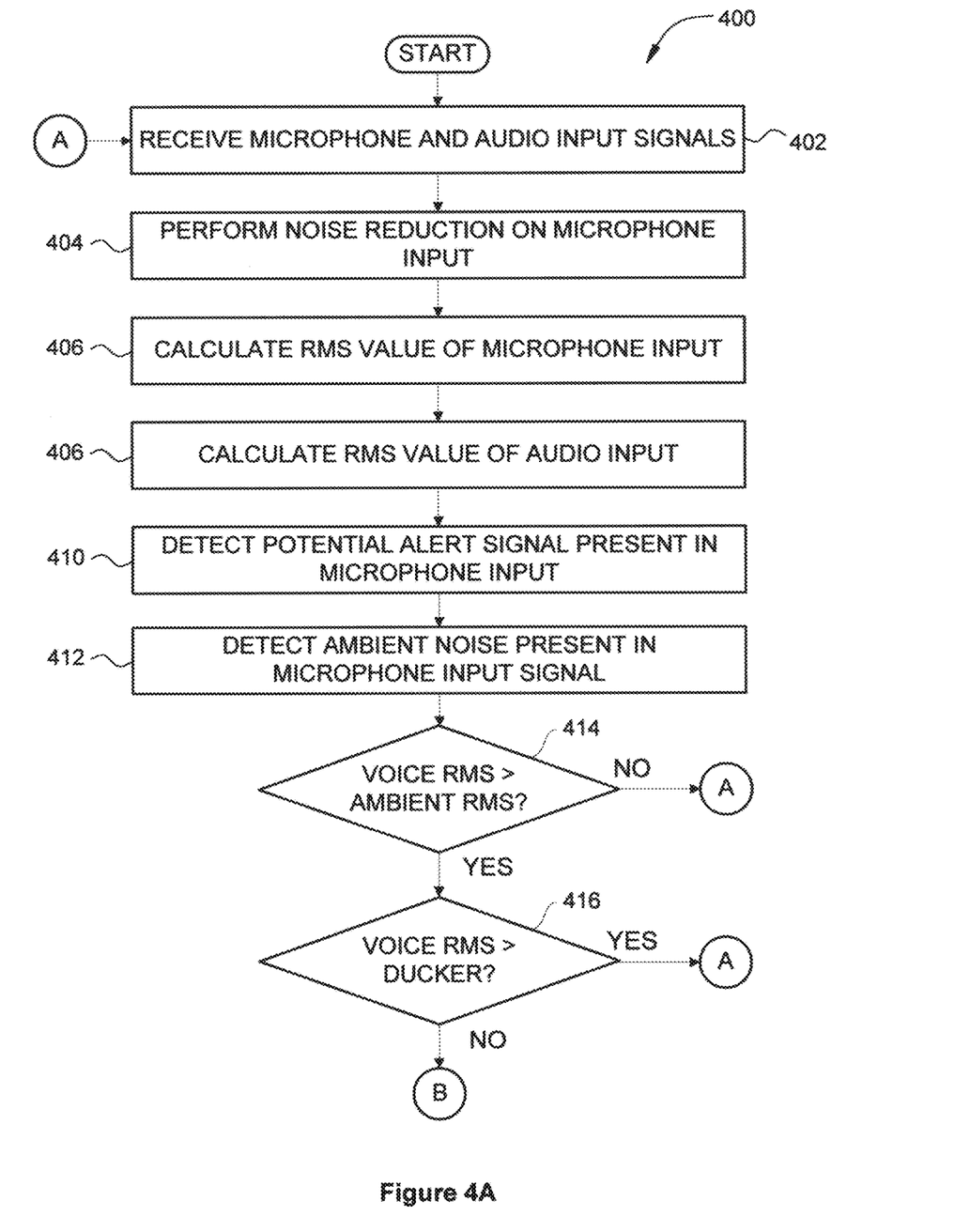
FIGS. 4A-4B set forth a flow diagram of method steps for processing entertainment signals and alert signals, according to various embodiments.
Figure 4B:
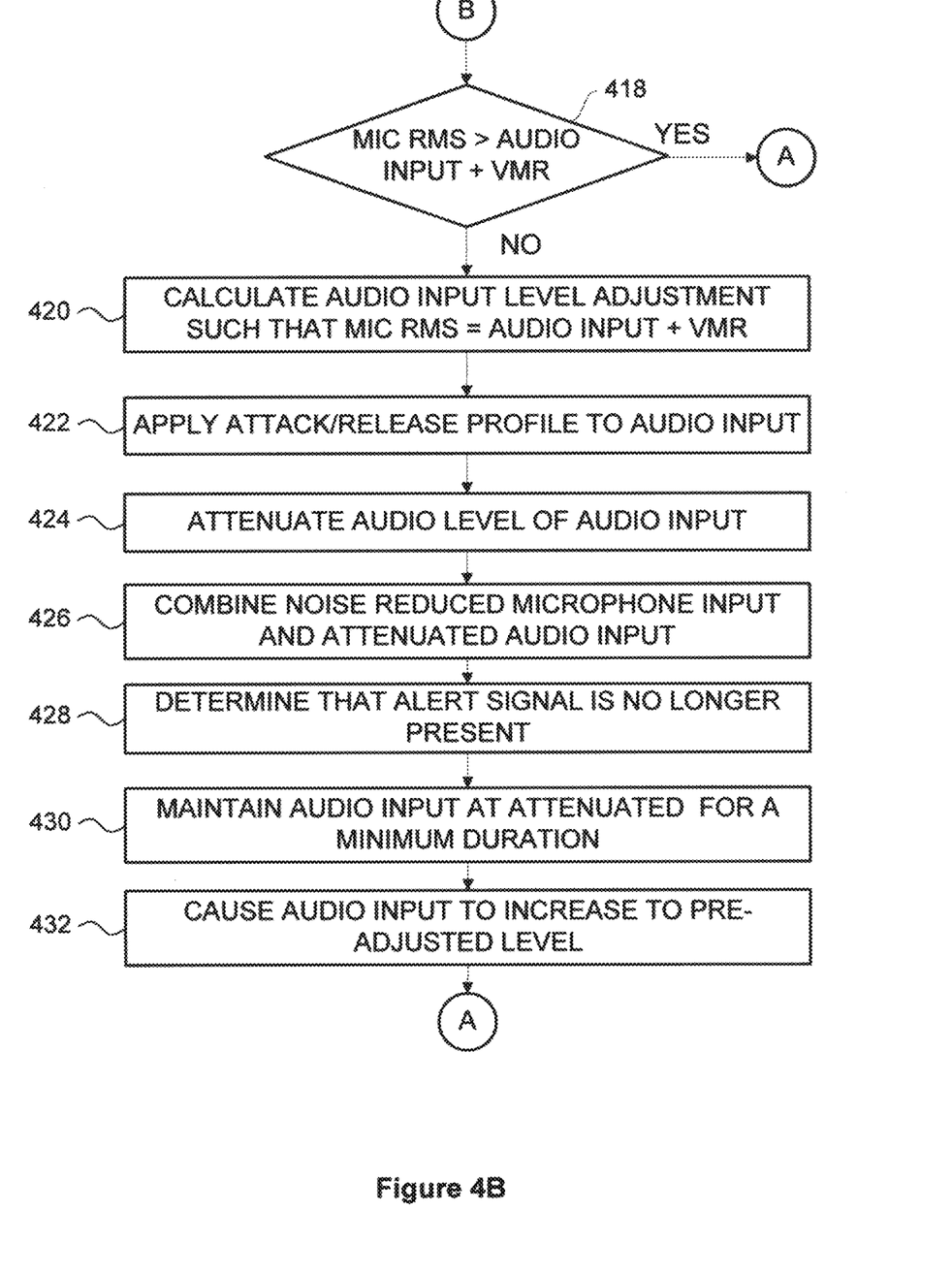

FIGS. 4A-4B set forth a flow diagram of method steps for processing entertainment signals and alert signals, according to various embodiments. Although the method steps are described in conjunction with the systems of FIGS. 1-3, persons skilled in the art will understand that any system configured to perform the method steps, in any order, is within the scope of the present disclosure.

As shown, a method 400 begins at step 402, where sound environment processor 130 receives environmental sound via a microphone input 105 and an entertainment signal via an audio input 110. The environmental sound represents the sound present in the environment of a listener. The entertainment signal represents music or other audio selected by the listener, such as music from an audio playback device. At step 404, sound environment processor 130 performs noise reduction on the environmental sound to remove low-level, steady-state sounds from the microphone input 105 signal, such as traffic noise and low-level microphone hiss. At step 406, the microphone RMS detector 145 calculates the RMS level of the voice separated sound received via the voice separator 135. At step 408, audio input RMS detector 150 calculates the RMS level of the entertainment signal received via the audio input 110.

At step 410, voice separator 135 detects that a potential alert signal, such as human speech, is present in the microphone input signal. In some embodiments, the voice separator 135 may perform this function by applying a first bandpass filter to the microphone input signal to generate a filtered microphone input signal. The voice separator 135 may calculate the RMS level associated with the filtered microphone input signal. If this RMS exceeds a threshold level, then an alert signal may be present in the microphone input signal.

At step 412, ambience separator 140 detects that ambient noise, such as background construction noise or background conversation noise, is present in the microphone input signal. Such ambient sound may still be present in the microphone input signal if the ambient noise is too loud or irregular to be filtered by noise reduction. In some embodiments, the ambience separator 140 may perform this function by applying a second bandpass filter to the microphone input signal to generate a filtered microphone input signal. The ambience separator 140 may calculate the RMS level associated with the filtered microphone input signal. The first and second bandpass filters may have the same frequency response, but the response time for ambient RMS detection may be slower than the response time for microphone input RMS detection.

At step 414, voice activity detector 155 determines whether the RMS level of the potential alert signal, such as voice or human speech, exceeds the RMS level of the ambient sound. If the RMS level of the signal of interest does not exceed the RMS level of the ambient sound, then the method 400 proceeds to step 402, described above. If, on the other hand, the RMS level of the signal of interest exceeds the RMS level of the ambient sound, then the method 400 proceeds to step 414, where the voice activity detector 155 determines whether the RMS level of the potential alert signal, such as voice or human speech, exceeds a ducker threshold level. If the RMS level of the signal of interest does not exceed the ducker threshold level, then the method 400 proceeds to step 402, described above. If, on the other hand, the RMS level of the signal of interest exceeds the ducker threshold level, then the method 400 proceeds to step 418, where ratio-based attenuator 165 determines whether the RMS level of the microphone input 105 exceeds the RMS level of the audio input 110 by at least a target difference, such as a voice-to-music ratio (VMR). In some embodiments, the target difference may be a fixed value. In other embodiments, the target difference may be user adjustable, or may depend on the entertainment signal level or on the alert signal level. If the RMS level of the microphone input 105 exceeds the RMS level of the audio input 110 by at least the VMR, then the method 400 proceeds to step 402, described above. If, on the other hand, the RMS level of the microphone input 105 does not exceed the RMS level of the audio input 110 by at least a target difference, then the method 400 proceeds to step 420, where ratio-based attenuator 165 calculates a reduction amount for the audio input 110 such that the RMS level of the microphone input 105 equals the RMS level of the audio input by the target difference.

At step 422, attack/release logic 170 applies an attack/release profile to the audio input 110. In some embodiments, attack/release logic 170 may apply a fast attack/slow release profile when presence or removal of an alert signal is first detected. Attack/release logic 170 may apply a slower attack/slower release profile when the alert signal has been present for a minimum duration of time. At step 424, voltage controlled amplifier 175 attenuates the audio input 110 based on the level of ducking determined in the prior steps. At step 426, mixer 180 combines the noise-reduced microphone input and the attenuated audio input.

At step 428, intelligent system monitor 160 determines that the alert signal is no longer present in the microphone input 105. At step 430, intelligent system monitor 160 maintains the audio level of the audio input 110 at the attenuated level for a minimum duration of time. At step 432, after expiration of the minimum duration of time, intelligent system monitor 160 causes the audio level of the audio input 110 to increase to the pre-adjusted level. The method 400 then proceeds to step 402, described above. In various embodiments, the steps of method 400 may be performed in a continuous loop until certain events occur, such as powering down a device that includes the audio processing system 100.

In sum, an audio processing system 100 combines environmental sound with an entertainment signal, such as music from an audio playback device, allowing the listener to continue to hear the entertainment signal at a reduced level relative to the environmental sound when an alert signal, such as speech, is present in the environmental sound. The audio processing system 100 attenuates or ducks the entertainment signal only enough to ensure that the alert signal is intelligible without attenuating the entertainment signal more than necessary, based on the levels of the entertainment signal and the alert signal. The audio processing system 100 receives a target voice-to-music (VMR) ratio, typically via a user control. The audio processing system 100 attenuates the entertainment signal just enough to maintain this target VMR ratio. The audio processing system 100 intelligently automatically detects the presence of an alert signal in noisy, loud, and complex sound environments, without end-user input or intervention.

At least one advantage of the approach described herein is that a listener who uses the disclosed listening device equipped with the audio processing system 100 hears a high-quality audio signal from an audio playback device plus certain alert signals from the environmental sound, while, at the same time, other sounds from the environmental sound are suppressed relative to the alert signal. The entertainment signal is reduced only when an alert signal is present in the environment sound and only to the degree necessary to hear the alert signal. As a result, the listener hears alert signals from the environment along with an improved entertainment signal relative to prior approaches, leading to a better quality audio experience for the listener.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, and without limitation, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. An audio processing system, comprising:
   an input device that receives a first audio signal;
   a voice activity detector that:
      receives a first control signal from a voice separator;
      determines that a signal of interest is present in the first audio signal based on the first control signal exceeding a ducker threshold; and
      generates a second control signal in response to the first audio signal; and
   a ratio-based attenuator that:
      receives the second control signal from the voice activity detector,
      determines whether a first signal level associated with the first audio signal exceeds a second signal level associated with a second audio signal received from an audio playback device, and
      if the first signal level exceeds the second signal, then maintains an audio level of the second audio signal, or
      if the first signal level does not exceed the second signal level difference, then causes the audio level of the second audio signal to be adjusted from a first value to a second value.

2. The audio processing system of claim 1, further comprising a sound environment analyzer that performs one or more noise reduction operations on the first audio signal to remove a noise signal from the first audio signal.

3. The audio processing system of claim 1, further comprising the voice separator that:
   applies a first bandpass filter to the first audio signal to generate a first filtered audio signal;
   calculates a third signal level associated with the first filtered audio signal; and
   generates the first control signal based on the third signal level.

4. The audio processing system of claim 3, further comprising an ambience separator that:
   applies a second bandpass filter to the first audio signal to generate a second filtered audio signal;
   calculates a fourth signal level associated with the second filtered audio signal; and
   generates a third control signal based on the fourth signal level.

5. The audio processing system of claim 4, wherein the first bandpass filter and the second bandpass filter have the same frequency range.

6. The audio processing system of claim 4, wherein the voice activity detector further:
   receives the third control signal from the ambience separator; and
   determines that the signal of interest is present in the first audio signal based on the first control signal also exceeding the third control signal.

7. The audio processing system of claim 1, further comprising a first signal level detector that calculates the first signal level; and a second signal level detector that calculates the second signal level.

8. The audio processing system of claim 1, further comprising an intelligent system monitor that:
   determines that the signal of interest is no longer present in the first audio signal;
   maintains the audio level of the second audio signal at the second level for a threshold duration of time; and after the threshold duration of time has expired, causes the audio level of the second audio signal to increase to the first level.

9. The audio processing system of claim 1, further comprising attack/release logic that applies a first attack/release profile to the second audio signal when the signal of interest is present or removed and applies a second attack/release profile to the second audio signal when the presence of the signal of interest has been detected for a threshold duration of time.

10. The audio processing system of claim 1, wherein the ratio-based attenuator generates a third control signal that indicates an amount that the second audio level is to be adjusted, and includes a voltage controlled amplifier that attenuates the second audio signal based on the third control signal to generate a third audio signal.

11. The audio processing system of claim 10, further comprising a mixer that combines the first audio signal with the third audio signal to generate an output signal, and transmits the output signal to a speaker.

12. A computer-implemented method, comprising:
receiving a first audio signal emanating from an environment;
detecting that a signal of interest is present in the first audio signal based on a first control signal associated with the first audio signal exceeding a ducker threshold;
determining whether a first signal level associated with the first audio signal exceeds a second signal level associated with a second audio signal received from an audio playback device, and
if the first signal level exceeds the second signal level, then maintaining an audio level of the second audio signal, and
if the first signal level does not exceed the second signal level, then causing the audio level of the second audio signal to be adjusted from a first value to a second value.

13. The method of claim 12, further comprising:
applying a first bandpass filter to the first audio signal to generate a first filtered audio signal;
calculating a third signal level associated with the first filtered audio signal;
generating the first control signal based on the third signal level.

14. The method of claim 13, further comprising:
applying a second bandpass filter to the first audio signal to generate a second filtered audio signal;
calculating a fourth signal level associated with the second filtered audio signal;
generating a second control signal based on the first signal level.

15. The method of claim 14, further comprising determining that the signal of interest is present in the first audio signal based on the first control signal also exceeding the second control signal.

16. A non-transitory computer-readable storage medium including instructions that, when executed by a processor, cause the processor to perform the steps of:
receiving a first audio signal emanating from an environment;
detecting that a signal of interest is present in the first audio signal based on a first control signal associated with the first audio signal exceeding a ducker threshold;
determining whether a first signal level associated with the first audio signal exceeds a second signal level associated with a second audio signal received from an audio playback device, and
if the first signal level exceeds the second signal level, then maintaining an audio level of the second audio signal, and
if the first signal level does not exceed the second signal level, then causing the audio level of the second audio signal to be adjusted from a first value to a second value.

* * * * *